United States Patent
Maeto

(10) Patent No.: US 8,051,366 B2
(45) Date of Patent: Nov. 1, 2011

(54) DATA REPRODUCING APPARATUS AND DATA REPRODUCING METHOD

(75) Inventor: Nobuhiro Maeto, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/833,812

(22) Filed: Jul. 9, 2010

(65) Prior Publication Data

US 2011/0010601 A1   Jan. 13, 2011

(30) Foreign Application Priority Data

Jul. 9, 2009   (JP) .............................. 2009-162932

(51) Int. Cl.
*H03M 13/00* (2006.01)

(52) U.S. Cl. ........ 714/795; 714/794; 714/796; 375/341; 375/262

(58) Field of Classification Search .......... 714/794–796; 375/341, 262

See application file for complete search history.

(56) References Cited

U.S. PATENT DOCUMENTS

| | | | | |
|---|---|---|---|---|
| 5,710,756 A | * | 1/1998 | Pasternak et al. | 370/216 |
| 5,910,182 A | * | 6/1999 | Dent et al. | 714/786 |
| 5,983,383 A | * | 11/1999 | Wolf | 714/755 |
| 6,981,205 B2 | * | 12/2005 | Fukushima et al. | 714/797 |
| 7,162,675 B2 | * | 1/2007 | Das et al. | 714/751 |
| 2002/0154434 A1 | | 10/2002 | Satoh et al. | |
| 2008/0037391 A1 | | 2/2008 | Nakamura | |

FOREIGN PATENT DOCUMENTS

| | | |
|---|---|---|
| JP | 2000-105901 A | 4/2000 |
| JP | 2003-007008 A | 1/2003 |
| JP | 2005-032312 A | 2/2005 |
| JP | 2006-048760 A | 2/2006 |
| JP | 3924491 B2 | 3/2007 |
| JP | 4239110 B2 | 1/2009 |
| WO | WO 2006/049155 | 5/2006 |
| WO | WO 2009/011378 A1 | 1/2009 |

OTHER PUBLICATIONS

Information Sheet for Information Disclosure Statement.
Notice of Reasons for Rejection mailed by Japan Patent Office on Sep. 21, 2010 in the corresponding Japanese patent application No. 2009-162932.

* cited by examiner

*Primary Examiner* — Esaw Abraham
(74) *Attorney, Agent, or Firm* — Knobbe Martens Olson & Bear LLP

(57) ABSTRACT

According to one embodiment, a data reproducing apparatus includes a reader, Viterbi decoder, metric difference calculator, an error correction decoder, and a detector. The reader reads data. The Viterbi decoder decodes the data read by the reader. The metric difference calculator calculates a metric difference between a maximum likelihood path and a competitive path, based on an output from the Viterbi decoder. The error correction decoder executes an error correction decoding for the output of the Viterbi decoder. The detector detects that an error detected by the error correction decoder is uncorrectable, and the metric difference detected by the metric difference calculator is larger than a predetermined value.

5 Claims, 5 Drawing Sheets

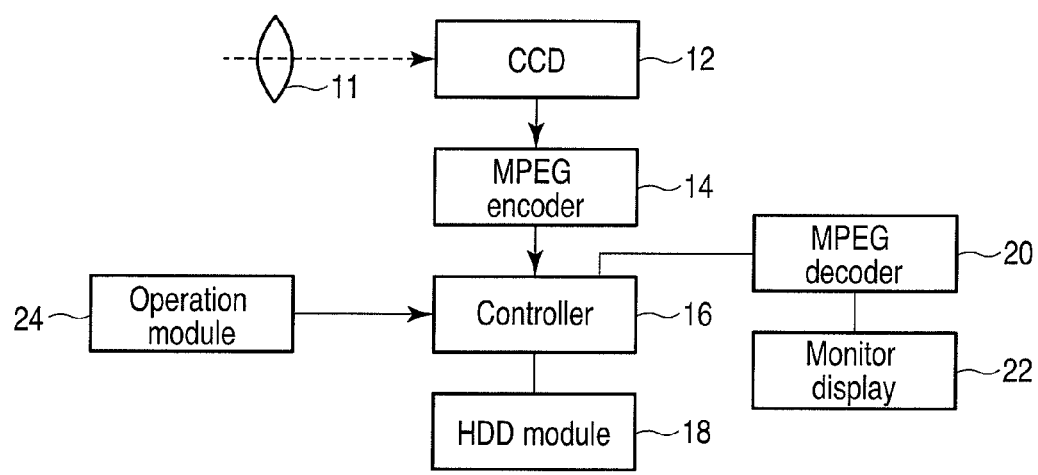
F I G. 1

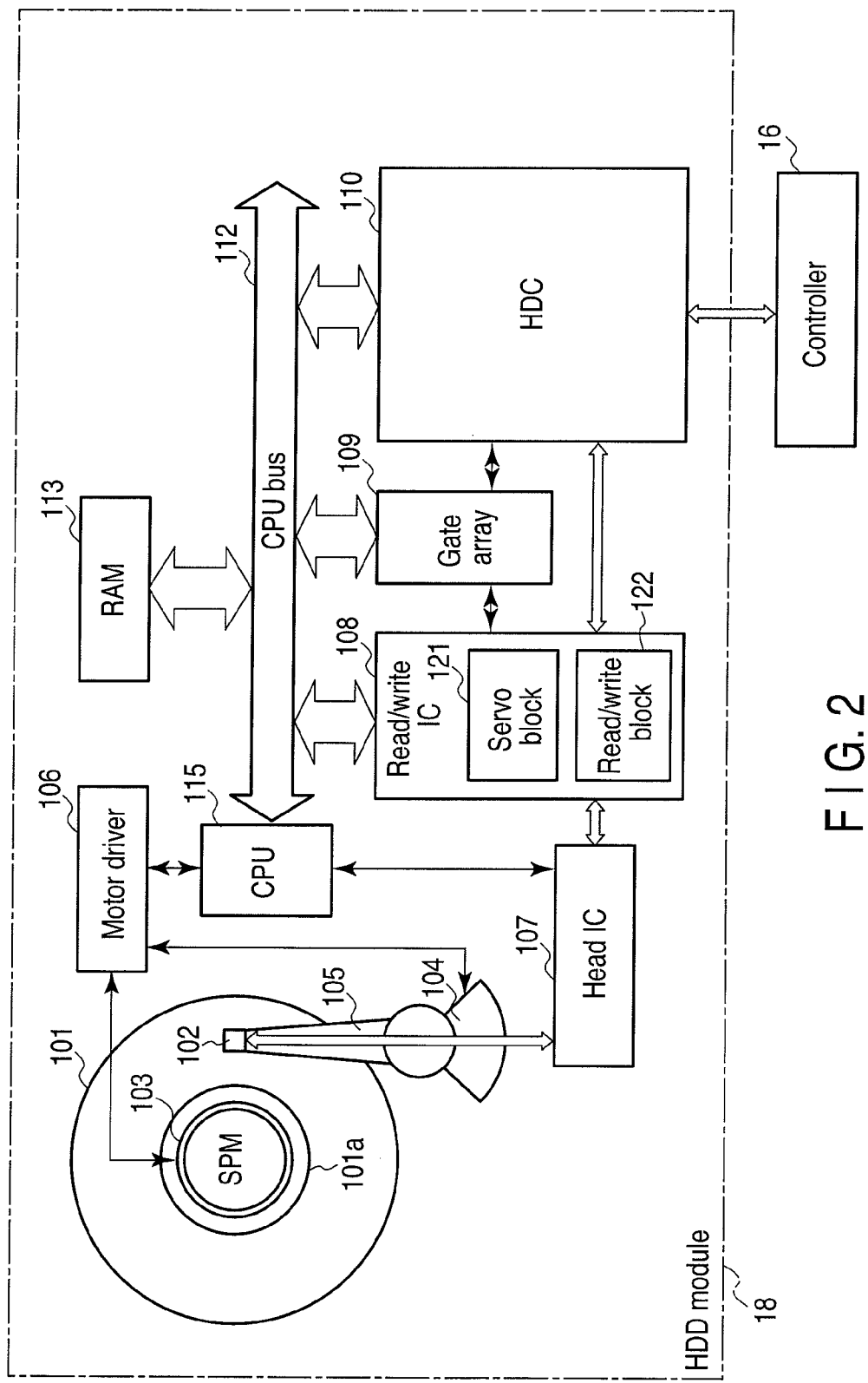
F I G. 2

DATA REPRODUCING APPARATUS AND DATA REPRODUCING METHOD

CROSS-REFERENCE TO RELATED APPLICATIONS

This application is based upon and claims the benefit of priority from Japanese Patent Application No. 2009-162932, filed Jul. 9, 2009; the entire contents of which are incorporated herein by reference.

FIELD

Embodiments described herein relate generally to a data reproducing apparatus and method using such recording media as hard disks and optical disks.

BACKGROUND

Data reproducing apparatuses for reproducing data from a storage medium on which data is recorded by means of magnetic or optical modulation comprise an error correction (ECC) circuit. When writing or reproducing digital data (encoded data), errors may occur in the data because of, for example, external noise. To detect and correct such errors, use is made of error correction codes (ECCs) whereby redundant data is added to data during encoding to form ECC blocks, and any errors in the data during decoding are corrected by the error correction circuit on the basis of the redundant data. If the error correction circuit cannot correct the errors, a read retry, in which the sector containing the errors is sought and read again, is executed. Such a data reproducing apparatus is described in Jpn. Pat. Appln. KOKAI Publication No. 2005-32312.

In the above prior art data reproducing apparatus, in which the read signal is subjected to waveform equalization, Viterbi decoding, demodulation, and ECC processing, the quality of the read signal is evaluated before the ECC processing is executed. This makes it possible to determine whether it will be necessary to execute a read retry before the ECC processing. Viterbi decoding involves the concept of a maximum likelihood path, in which the accumulated error (path metric) between sampled values of a data sequence at a series of time points and ideal waveform equalization values is minimized. By determining the maximum likelihood path and the next maximum likelihood path (competitive path), the difference in their metrics can be calculated to yield a sequenced amplitude margin (SAM). If the SAM is low, there is a strong possibility that the next maximum likelihood path will be erroneously selected because of the influence of, for example, noise. In other words, if the SAM is low, an error will easily occur. Thus read retry is controlled in accordance with the SAM. If SAM<k, complete error correction is possible with normal ECC processing, so read retry is unnecessary. If m≧SAM≧k, complete error correction is not possible with normal ECC processing and the error correction performance of the ECC processing must be enhanced. If SAM>m, no error correction is possible even if the error correction performance of the ECC processing is enhanced, and so a read retry must be executed. (Note that k<m.)

Basing the error correction performance of enhanced ECC processing on the SAM to avoid read retry is central to the prior art data reproducing apparatus.

However, if, during the writing of data, the writing is stopped by, for example, interruption of power, a partially overwritten sector may be left on the disk. Thus the data in the sector may include two code words having different parity, so that even if ECC processing is executed repeatedly, error correction will in all likelihood be impossible. Furthermore, error correction decoding will always fail even if read retry is executed repeatedly.

Since the prior art data reproducing apparatus executes a read retry even on a sector which is unreadable because writing was interrupted, users are forced to wait needlessly.

BRIEF DESCRIPTION OF THE DRAWINGS

A general architecture that implements the various feature of the embodiments will now be described with reference to the drawings. The drawings and the associated descriptions are provided to illustrate the embodiments and not to limit the scope of the invention.

FIG. 1 is an exemplary block circuit diagram illustrating a schematic configuration of a video camcorder according to an embodiment of a data reproducing apparatus.

FIG. 2 is an exemplary block circuit diagram illustrating the configuration of an HDD module 18 shown in FIG. 1.

DETAILED DESCRIPTION

Figure 3:
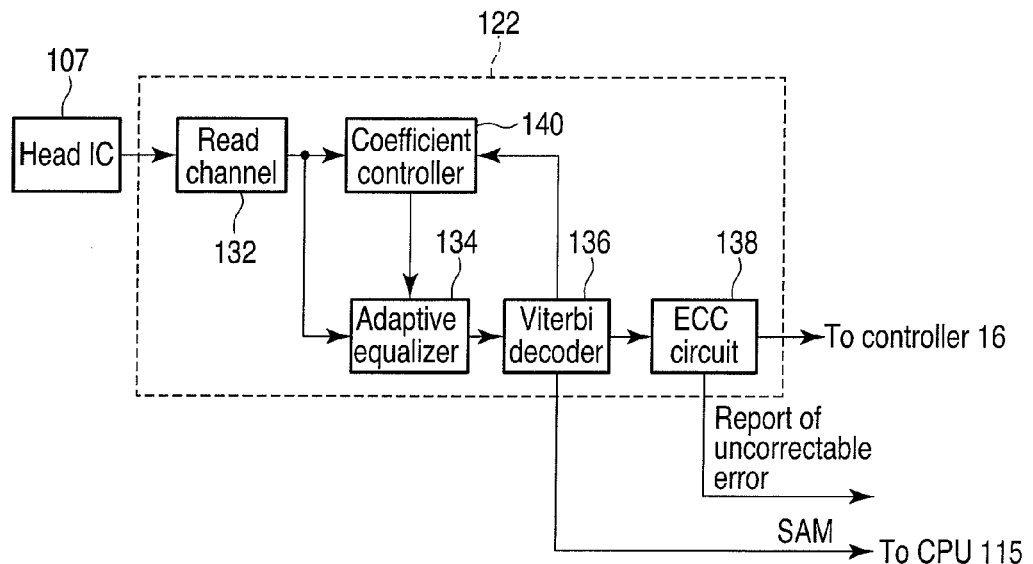
FIG. 3 is an exemplary block circuit diagram illustrating the configuration of a read/write block 122 shown in FIG. 2.

Various embodiments will be described hereinafter with reference to the accompanying drawings.

In general, according to one embodiment, a data reproducing apparatus comprises a reader, Viterbi decoder, metric difference calculator, an error correction decoder, and a detector. The reader is configured to read data. The Viterbi decoder is configured to decode the data read by the reader. The metric difference calculator is configured to calculate a metric difference between a maximum likelihood path and a competitive path, based on an output from the Viterbi decoder. The error correction decoder is configured to execute an error correction decoding for the output of the Viterbi decoder. The detector is configured to detect that an error detected by the error correction decoder is uncorrectable, and the metric difference detected by the metric difference calculator is larger than a predetermined value.

FIG. 1 is a block circuit diagram illustrating a schematic configuration of a video camcorder 10. An embodiment will be described in detail with reference to the accompanying drawings. In the embodiment, optical disks, such as DVDs, are usable as a recording medium, as well as hard disks. However, in the embodiment described below, a description will be given of a case where a hard disk is applied, in particular, to a video camcorder as a mobile unit in which tracking servo operation may well fail and accordingly read operation may well fail, because of external impacts or vibrations.

The video camcorder 10 comprises an optical system 11, a CCD image pickup unit 12, an MPEG encoder 14, a controller 16, a hard disk (HDD) unit 18, an MPEG decoder 20 and a monitor display 22.

The optical system 11 includes, for example, a lens. The CCD image pickup unit 12 photographs a subject via the optical system 11, and converts the photographing result into an electric signal. The MPEG encoder 14 compresses the electric signal from the CCD image pickup unit 12 by means of encoding based on the MPEG scheme, thereby generating video data. The controller 16 includes an operation module 24, and controls the entire operation of the video camcorder 10 in accordance with an operation of the operation module 24. The controller 16 outputs video data, obtained each time image pickup is executed, as a title file to the HDD module 18.

The HDD module 18, which is shown in detail in FIG. 2, stores video data per title file in the hard disk. The video data stored in the hard disk can be selected per title file by operating the operation module 24. The controller 16 can output video data to the MPEG decoder 20 during or after photographing in response to an operation of the operating unit 24. The MPEG decoder 20 expands the video data by MPEG scheme decoding. The monitor display 22 displays the video data sent from the MPEG decoder 20

FIG. 2 shows the circuit configuration of the HDD module 18. The HDD module 18 is a storage device for writing and reading data (including encrypted data) to and from the recording surface of a disk (magnetic disk) 101 in response to a request from the controller 16 as a host system.

The disk 101 is secured to a spindle motor (SPM) 103, and is rotated at a preset rotational speed when the SPM 103 is driven. For example, one of the surfaces of the disk 101 serves as the recording surface on which data is magnetically recorded. A head (magnetic head) 102 is opposed to the recording surface of the disk 101. The head 102 is secured to one end of an actuator 105. The other end of the actuator 105 is secured to a voice coil motor (VCM) 104. When the VCM 104 is driven, the head 102 is movable over the range in which the arc orbit about the axis of the VCM 104 overlaps with the recording surface of the disk 101.

In the configuration of FIG. 2, it is assumed that the HDD module 18 employs a single disk 101. However, the embodiment is also applicable to a structure in which a plurality of disks 101 are secured to the SPM 103 with preset intervals therebetween. In this case, a plurality of actuators 105 are secured to the VCM 104 so that they are positioned between respective pairs of adjacent disks 101. Each head 102 is secured to one end of the corresponding actuator 105. Accordingly, when the SPM 103 is driven, all disks 101 are simultaneously rotated, and when the VCM 104 is driven, all heads 102 are simultaneously moved. Although in the configuration of FIG. 2, one side of each disk 101 serves as a recording surface, both sides of each disk 101 may serve as recording surfaces, and heads 102 may be provided correspondingly to the both sides.

A CPU 115 functions as a main controller for the HDD module 18. The CPU 115 causes a motor driver 106 to start and stop the SPM 103, and maintain the rotational speed of the SPM 103. The CPU 115 also causes the motor driver 106 to drive the VCM 104 so as to move the head 102 to a target track and position it in a target area on the target track.

The positioning of the head 102 is executed in a steady rotation state assumed when the SPM 103 is started. Servo areas are provided on the disk 101 at circumferentially regular intervals, although they are not shown. Accordingly, signals corresponding to servo data recorded on the servo areas appear at regular intervals in the analog signal corresponding to the data read from the disk 101 and amplified by a head IC 107. A read/write IC 108 (more specifically, a servo block 121 included in the read/write IC 108) and a gate array 109 process the analog signal utilizing the above state, thereby generating a signal for positioning the head 102. Based on this signal, the CPU 115 controls the motor driver 106 to supply the VCM 104 in a real-time manner with a current (VCM current) for positioning the head 102.

In addition to controlling the SPM 103 and the VCM 104 via the motor driver 106 as described above, the CPU 115 executes control and command processing for the other elements in the HDD module 18. The CPU 115 is connected to a CPU bus 112.

The CPU bus 112 is also connected to the read/write IC 108, the gate array 109, a disk controller (HDC) 110 and a RAM 113. The RAM 113 is used to store, for example, various variables used by the CPU 115. Part of the RAM 113 is used as a work area for the CPU 115.

The read/write IC 108 includes a servo block 121 and a read/write block 122. The servo block 121 executes signal processing that is necessary to position the head 102 and includes extraction of servo signals. The read/write block 122 executes signal processing (including encoding/decoding processing) for data writing. The gate array 109 generates various signals for control that include a signal for causing the servo block 121 to extract servo signals.

The HDC 110 is connected to the read/write IC 108 and the gate array 109, as well as to the CPU bus 112. The HDC 110 has a host interface control function of receiving commands (such as a write command and a read command) transferred from the controller 16, and controlling data transfer between the host and the HDC 110.

The read/write IC 108, the gate array 109 and the HDC 110 have respective control registers. Part of the memory space for the CPU 115 is used as the control registers. By accessing the part of the memory space, the CPU 115 controls the read/write IC 108, the gate array 109 and the HDC 110.

FIG. 3 shows the circuit configuration of the part of the read/write block 122 associated with reading. The read/write block 122 comprises a read channel 132 for receiving signals from the head IC 107, an adaptive equalizer 134 for receiving the output of the read channel 132, a coefficient controller 140, a Viterbi decoder 136 for receiving a read signal having a waveform equalized by the adaptive equalizer 134, and an ECC circuit 136 for receiving the output of the Viterbi decoder 136.

In the Viterbi decoder 136, the reading/writing system is assumed to have a preset PR characteristic, each signal sequence is expressed by addition of impulse responses to recorded bits, and the addition result is called a path. The Viterbi decoder 136 accumulates errors between each of the read signals actually read at respective sampling points, and all estimated paths corresponding to said each read signal, thereby selecting a path having the minimum accumulated errors. The bit sequence corresponding to the selected path is output as a decoded signal.

Figure 4:
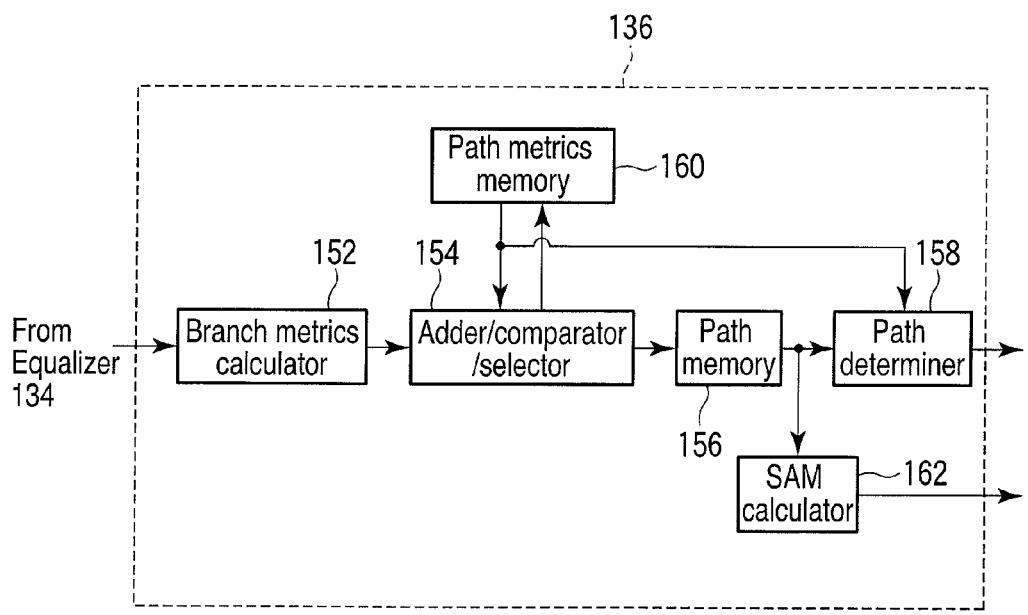
FIG. 4 is an exemplary block circuit diagram illustrating the configuration of a Viterbi decoder 136 shown in FIG. 3.

FIG. 4 shows the configuration of the Viterbi decoder 136. The Viterbi decoder 136 comprises a branch metrics calculator 152, an addition/comparison/selection unit 154, a path memory 156, a path determiner 158, a path metrics memory 160 and a SAM calculator 162. The branch metrics calculator 152 executes branch metrics calculation using the output of the adaptive equalizer 134. The addition/comparison/selection unit 154 executes addition, comparison and selection concerning the output of the branch metrics calculator 152 and the path metrics stored in the path metrics memory 160, thereby determining the maximum likelihood path and the path metric corresponding thereto. The path memory 156 stores data indicating the selection procedure of the maximum likelihood path. Based on the selection result stored in the memory, the path determiner 158 determines and outputs a final decoding signal. The output of the path memory 156 is also input to the SAM calculator 162, where the metric difference (SAM) between the maximum likelihood path and the next maximum likelihood path (competitive path) is calculated. The SAM 162 as the calculation result is supplied to the CPU 115.

An equalized error signal generated by the input and output signals of the Viterbi decoder 136 is supplied to the coefficient controller 140, where a coefficient for the adaptive equalizer 134 is controlled by learning. Based on the coefficient, the adaptive equalizer 134 equalizes the waveform of a read signal from the read channel 132 in accordance with a preset PR characteristic.

The output of the Viterbi decoder 136 is subjected to error correction decoding in the ECC circuit 138. If an uncorrectable error is detected, a notice of the uncorrectable error is sent to the CPU 115.

Figure 5:
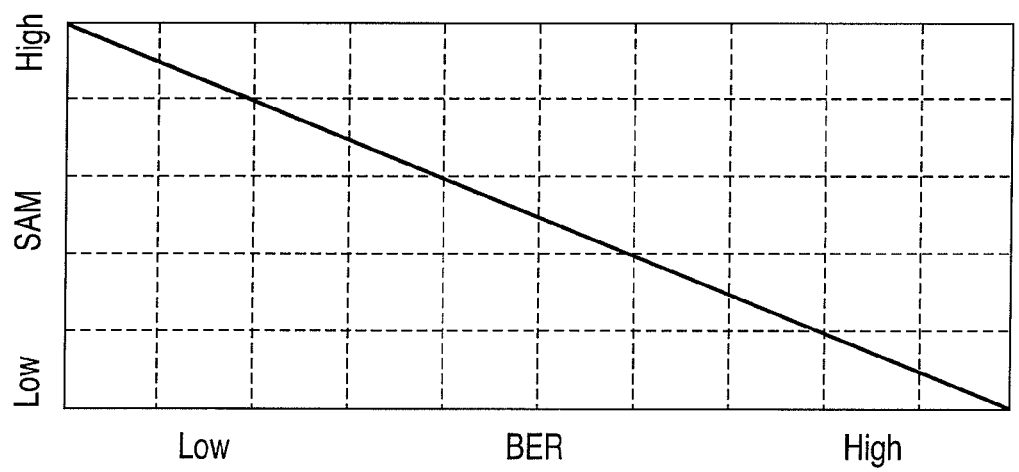
FIG. 5 is an exemplary view illustrating the relationship between the SAM and the bit error rate.

FIG. 5 shows the relationship between the SAM and the error rate (BER). The error rate indicates the ratio of the number of unreadable (uncorrectable) sectors to all read sectors. It is determined from certain experimental results that the smaller the SAM, the lower the error rate, while the greater the SAM, the higher the error rate.

Figure 6:
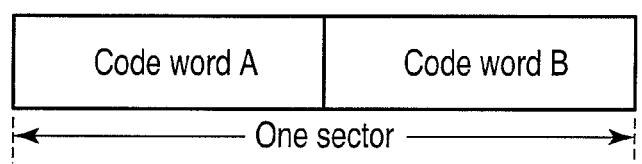
FIG. 6 is an exemplary view illustrating the data structure of a sector on which writing is interrupted.

FIG. 6 shows the data structure of a sector on which writing is interrupted. Assume here that a code word B is recorded on a sector, and a code word A is attempted to be overwritten on the word B. If, for example, power is interrupted during writing, only part of the code word A is overwritten. Since in this state, the two code words coexist, the ECC circuit 138 cannot execute error correction. In this case, the ECC circuit 138 supplies an uncorrectable error notice to the CPU 115.

Figure 7:
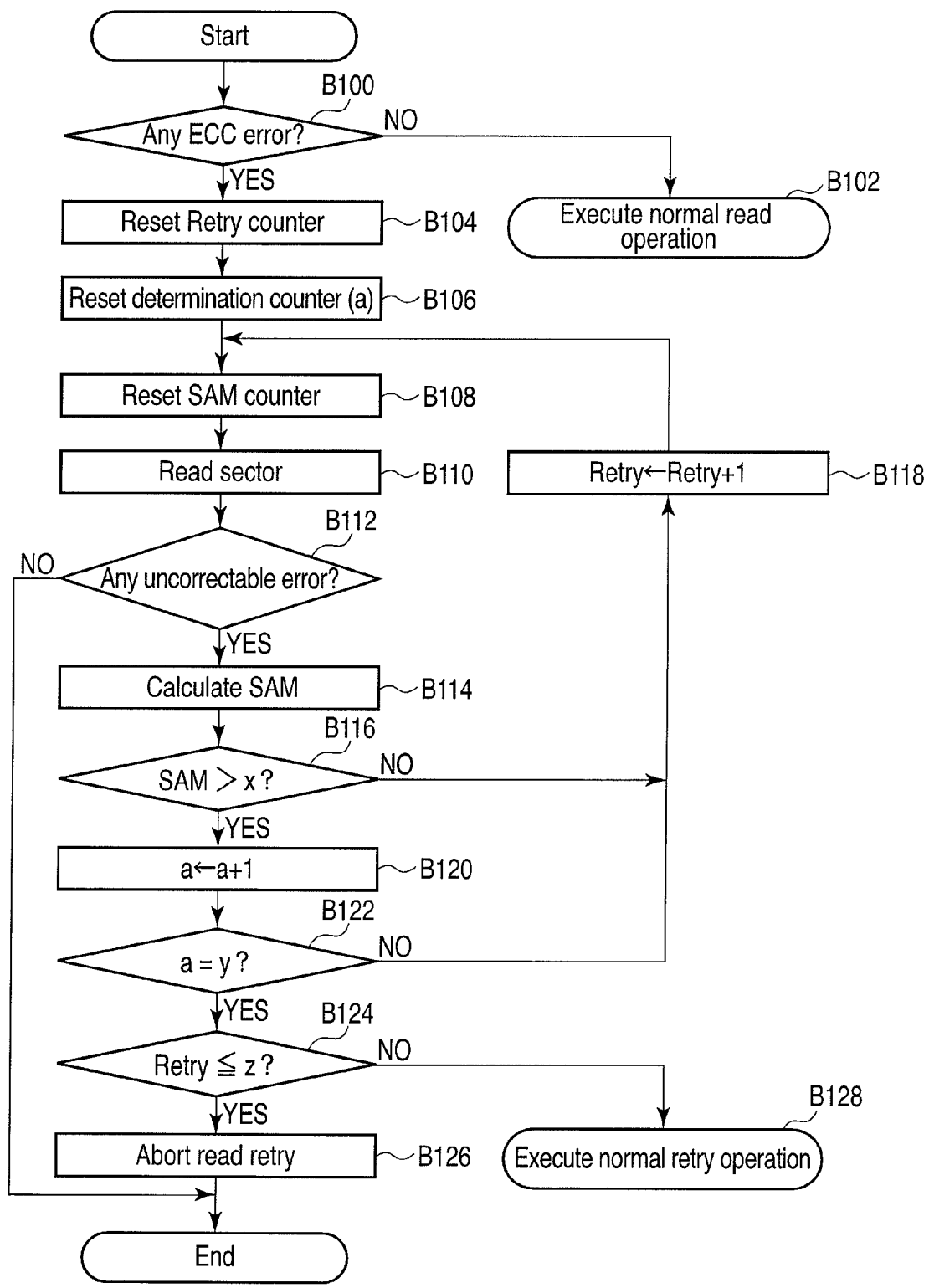
FIG. 7 is an exemplary flowchart useful in explaining a read operation executed in the embodiment when a read retry abort mode is designated.

A description will now be given of a read operation executed in the embodiment. When the ECC circuit 138 cannot execute error correction, a read retry is executed a preset number of times, e.g., 200 times. In this embodiment, the read retry mode and a read retry abort mode can be selectively set. In the read retry abort mode, such a write-interrupted sector as shown in FIG. 6 is detected, and the number of read retries executed on the sector is limited, thereby omitting the needless waiting time. FIG. 7 is a flowchart useful in explaining a read operation executed when the read retry abort mode is selected.

The ECC circuit 138 determines at block B100 that there is an uncorrectable error. If there is no such error, a normal read operation is executed at block B102. In contrast, if there is an uncorrectable error, a retry counter Retry is reset at block B104, a parameter a for write-interrupted sector determination is reset at block B106, and a SAM counter is reset at block B108.

At block B110, data is read from a certain sector. At block B112, it is determined whether the ECC circuit 138 has correctly read the sector data, i.e., whether there is a notice of an uncorrectable error is sent from the ECC circuit 138. If there is no such notice, the SAM is calculated at block B114. At block B116, it is determined whether the calculated SAM is greater than a threshold value x, i.e., whether the error rate is low. If it is determined that the calculated SAM is not greater than the threshold value x, i.e., that the error rate is high, this means that the reliability of the read data is low and it is strongly possible that the data will be correctly read by another read retry. Accordingly, in this case, at block B118, the retry counter Retry is incremented, and the program returns to block B108, where another read retry is executed.

In contrast, if the calculated SAM is greater than the threshold value x, i.e., the error rate is low, this means that the ECC circuit 138 has detected an uncorrectable error although the reliability of the data is high, and therefore that it is strongly possible that the sector is a write-interrupted sector. This being so, the parameter a for write-interrupted sector determination is incremented at block B120, and it is determined at block B122 whether the number a of write-interrupted sector determinations reaches a threshold value y. If the number a of write-interrupted sector determinations does not reach a threshold value y, the retry counter Retry is incremented, and the program returns to block B108, where another read retry is executed. Thus, since it cannot be determined based on only one-time SAM determination whether the target sector is a write-interrupted sector, it is determined that the target sector is the write-interrupted sector, when it is detected y times (y=threshold value) that the SAM exceeds the threshold value x.

If the number a of the write-interrupted sector determinations reaches the threshold value y, it is determined at block B124 whether the count value of the retry counter Retry is not greater than a threshold value z (z>y). The count value of the retry counter Retry indicates the number of read retries executed on the write-interrupted sector. If the count value is not greater than the preset value z, a further read retry on this sector is aborted. In contrast, if the count value is greater than the preset value z, a normal read retry (without any read retry abort determination) is executed at block B128.

For instance, assuming that 200 read retries are executed during normal reading, after the SAM determination is executed 10 times (=y times), the target sector is determined to be a write-interrupted sector. In this case, if the count value of the retry counter Retry is not higher than 30 (=z), read retry abort is executed. The threshold values (y, z) for the read retry abort are set such that if 10 (=y) write-interrupted sector determinations are executed while 30 (=z) read retries are executed, read retry abort is executed.

As described above, in the embodiment, the Viterbi decoder calculates the SAM as the metric difference between the maximum likelihood path and the competitive path, and estimates the error rate of the ECC circuit. When an uncorrectable error exists on a target sector even if the error rate is low, this sector is determined to be a write-interrupted sector. More specifically, a target sector is determined to be a write-interrupted sector, after it is determined a preset number of times that the sector contains an uncorrectable error even if the error rate is low. For the sector determined to be the write-interrupted sector, a further read retry is aborted. Since thus, the number of read retries executed on the write-interrupted sector that can never be read is limited, users are prevented from being forced to wait needlessly.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A data reproducing apparatus comprising:
   a reader configured to read data per sector;
   a Viterbi decoder configured to decode the data per sector read by the reader;
   a metric difference calculator configured to calculate a metric difference between a maximum likelihood path and a competitive path, based on an output from the Viterbi decoder;

an error correction decoder configured to detect an error in the output of the Viterbi decoder and to execute the error correction decoding on the error;

a detector configured to detect whether the detected error is uncorrectable, and that the calculated metric difference is larger than a predetermined value; and an abort module configured to abort a read retry for a target sector when the detector detects that the detected error is uncorrectable and that the calculated metric difference is larger than the predetermined value for a predetermined number of times.

2. The apparatus of claim 1, further comprising a read retry module configured to execute a read retry for the target sector when the detector detects that the detected error is uncorrectable, and that the calculated metric difference is smaller than the predetermined value.

3. A data reproducing method comprising:

executing Viterbi decoding for read data per sector;

calculating a metric difference between a maximum likelihood path and a competitive path, based on Viterbi decoded data;

executing an error correction decoding for the Viterbi decoded data;

detecting that an error is uncorrectable, and a calculated metric difference is larger than a predetermined value; and aborting a read retry for a target sector when the detected error is determined to be uncorrectable and the calculated metric difference is larger than the predetermined value for a predetermined number of times.

4. The method of claim 3, further comprising executing a read retry for the target sector when it is detected that the detected error is uncorrectable, and that the calculated metric difference is smaller than the predetermined value.

5. A data reproducing apparatus for reproducing data from a hard disk, comprising:

a Viterbi decoder configured to decode sector data read from the hard disk;

an error correction decoder configured to detect whether an output of the Viterbi decoder contains an error, and to execute an error correction decoding for the output of the Viterbi decoder;

a determiner configured to determine whether writing of sector data is interrupted, based on the output of the Viterbi decoder and an output of the error correction decoder;

a limiter configured to limit a number of retries of the sector data, when the determiner determines that the writing of the sector data is interrupted, wherein the determiner comprises:

a metric difference calculator configured to calculate a metric difference between a maximum likelihood path and a competitive path, based on the output of the Viterbi decoder; and a write interruption detector configured to detect that the writing of sector data is interrupted, upon detecting that the detected error is uncorrectable, and that the calculated metric difference is larger than a predetermined value.

* * * * *